US008552504B2

(12) United States Patent
Luo et al.

(10) Patent No.: US 8,552,504 B2
(45) Date of Patent: Oct. 8, 2013

(54) SEMICONDUCTOR DEVICE AND METHOD FOR FORMING THE SAME

(75) Inventors: Zhijiong Luo, Poughkeepsie, NY (US); Haizhou Yin, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/378,253

(22) PCT Filed: Mar. 2, 2011

(86) PCT No.: PCT/CN2011/071460
§ 371 (c)(1),
(2), (4) Date: Dec. 14, 2011

(87) PCT Pub. No.: WO2012/068797
PCT Pub. Date: May 31, 2012

(65) Prior Publication Data
US 2012/0261674 A1 Oct. 18, 2012

(30) Foreign Application Priority Data
Nov. 22, 2010 (CN) .......................... 2010 1 0557270

(51) Int. Cl.
*H01L 21/70* (2006.01)
(52) U.S. Cl.
USPC ............. 257/368; 257/E21.409; 257/E29.255
(58) Field of Classification Search
USPC ................... 257/77, E21.409, E29.255, 192, 257/368; 438/285, 627
See application file for complete search history.

(56) References Cited

U.S. PATENT DOCUMENTS

| 7,927,989 B2 * | 4/2011 | Zhang et al. ................. 438/524 |
| 2006/0166422 A1 | 7/2006 | Suenaga |
| 2009/0026552 A1 | 1/2009 | Zhang |

FOREIGN PATENT DOCUMENTS

| CN | 100477131 C | 4/2009 |
| KR | 20040042932 A | 5/2004 |
| KR | 1020040042932 * | 5/2004 |

OTHER PUBLICATIONS

International Search Report PCT/CN2011/071460.

* cited by examiner

*Primary Examiner* — Jarrett Stark
*Assistant Examiner* — Shahed Ahmed
(74) *Attorney, Agent, or Firm* — Troutman Sanders LLP

(57) ABSTRACT

The present invention provides a semiconductor device, which is formed on a semiconductor substrate, comprising a gate stack, a channel region, and source/drain regions, wherein the gate stack is on the channel region, the channel region is in the semiconductor substrate, the source/drain regions are embedded in the semiconductor substrate, and each of the source/drain regions comprises a sidewall and a bottom, a second semiconductor layer being sandwiched between the channel region and a portion of the sidewall distant from the bottom, a first semiconductor layer being sandwiched between the semiconductor substrate and at least a portion of the bottom distant from the sidewall, and an insulating layer being sandwiched between the semiconductor substrate and the other portions of the bottom and/or the other portions of the sidewall. The present invention also provides a method for forming the semiconductor device. The present invention helps preventing the dopants in the source/drain regions from diffusing into the substrate.

6 Claims, 3 Drawing Sheets

SEMICONDUCTOR DEVICE AND METHOD FOR FORMING THE SAME

CROSS-REFERENCE TO RELATED APPLICATION

This application is a National Phase Application of, and claims priority to, International Application No. PCT/CN2011/071460, filed on Mar. 2, 2011, which claimed priority to Chinese Application No. 201010557270.4, filed on Nov. 22, 2010. Both of the International Application and the Chinese Application are incorporated herein by reference in their entireties.

FIELD OF THE INVENTION

The present invention relates to the field of semiconductor manufacture, and particularly relates to a semiconductor device and a method for forming the same.

BACKGROUND OF THE INVENTION

As the development of semiconductor technology, the size of CMOS (Complementary Metal Oxide Semiconductor) devices continues to shrink. After entering the nanometer times, many problems relative to the limit of the semiconductor device have appeared. Such problems include, in particular, capacitance loss, short channel effects, increase of leakage, and degradation of device isolation, which are caused by diffusion of dopants in the source/drain regions into the substrate. The problem of the diffusion of the dopants into the substrate is currently solved by SOI (Semiconductor On Insulator) technology, in which an insulating layer (e.g. a $SiO_2$ Buried Oxide) is buried between two semiconductor substrates (e.g. Si substrates) to isolate transistor devices. The $SiO_2$ Buried Oxide can effectively prevent diffusion of the dopants into the substrate, so as to alleviate the parasitical capacitance of the device and the short channel effects.

However, in the SOI technology, CMOS devices are manufactured using a SOI wafer formed by complex processes as a substrate. Thus, it is necessary to improve the structure of the CMOS devices and their manufacturing process to provide a simpler structure for preventing the dopants in the source/drain regions from diffusing into the substrate, as well as a method for forming the structure.

SUMMARY OF THE INVENTION

The object of the present invention is to provide a semiconductor device and a method for forming the same, to prevent dopants in the source/drain regions from diffusing into the semiconductor substrate.

The present invention provides a semiconductor device, which is formed on a semiconductor substrate, comprising a gate stack, a channel region, and source/drain regions, wherein the gate stack is on the channel region, the channel region is in the semiconductor substrate, the source/drain regions are embedded in the semiconductor substrate, and each of the source/drain regions comprises a sidewall and a bottom, a second semiconductor layer being sandwiched between the channel region and a portion of the sidewall distant from the bottom, a first semiconductor layer being sandwiched between the semiconductor substrate and at least a portion of the bottom distant from the sidewall, and an insulating layer being sandwiched between the semiconductor substrate and the other portions of the bottom and/or the other portions of the sidewall.

The present invention also provides a method for forming the above semiconductor device, comprising:

forming a gate stack on a semiconductor substrate, and forming recesses each having a sidewall and a bottom in the semiconductor substrate using the gate stack as a mask;

forming a first semiconductor layer and a source/drain material layer in sequence, wherein the first semiconductor layer covers the sidewall and the bottom, and the material of the first semiconductor layer is different from the material of the semiconductor substrate and the material of the source/drain material layer;

removing a portion of the first semiconductor layer to form a first gap, which exposes at least the sidewall;

filling a portion of the first gap with an insulating material to form a second gap, which exposes a portion of the sidewall close to the gate stack; and filling the second gap with a second semiconductor layer.

The second semiconductor layer is sandwiched between the channel region and a portion of the sidewall distant from the bottom, the first semiconductor layer is sandwiched between the semiconductor substrate and at least a portion of the bottom distant from the sidewall, and the insulating layer is sandwiched between the semiconductor substrate and other portions of the bottom and/or the other portions of the sidewall. The second semiconductor layer formed between the source/drain regions and the channel region near the gate stack helps maintaining a carrier transfer path between the source/drain regions and the channel region near the gate stack. The insulating layer formed between the source/drain regions and the channel region distant from the gate stack forms an isolating region between the source/drain regions and the channel region distant from the gate stack, and helps preventing the dopants in the source/drain regions from diffusing into the substrate.

DETAILED DESCRIPTION OF THE EMBODIMENTS

The following disclosure provides many different embodiments or examples. In order to simplify the disclosure of the present invention, the following description only describes components and arrangements of specific examples. It is apparent that they are only for exemplifying rather than limiting the present invention. Further, the present invention may iterate reference numbers and/or letters in different examples. Such iterations are for purpose of simplification and clarity rather than indicating relationships between various embodiments discussed and/or arrangements. In addition, the present invention provides examples of various specific processes and materials. However, those skilled in the art will appreciate applications of other processes and/or other materials.

Figure 5:
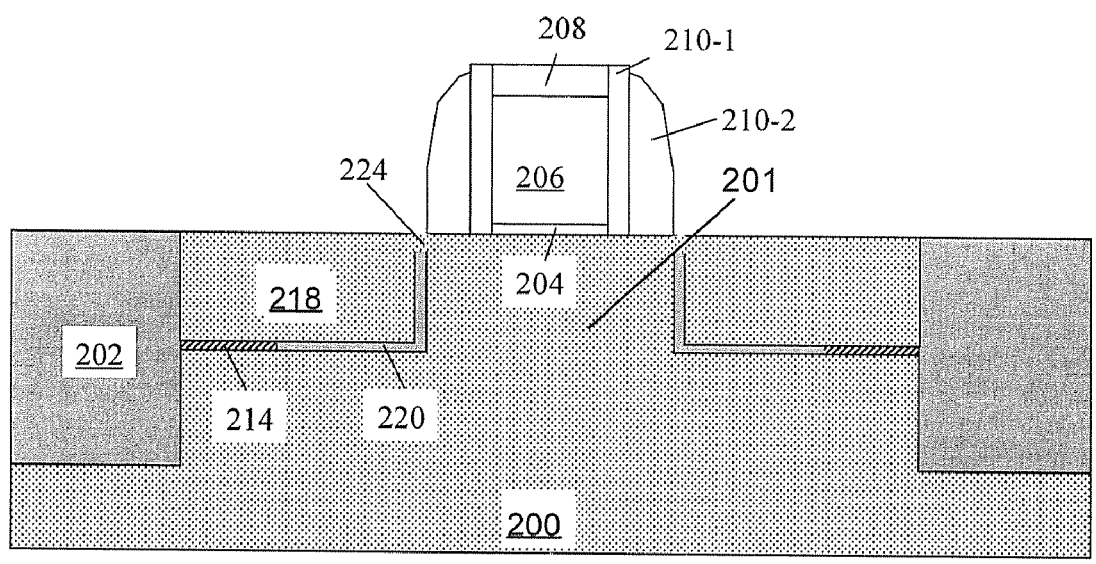

As shown in FIG. 5, the present invention provides a semiconductor device, which is formed on a semiconductor substrate 200, comprising a gate stack, a channel region 201, and source/drain regions 218, wherein the gate stack is on the channel region 201, the channel region 201 is in the semiconductor substrate 200, the source/drain regions 218 are embedded in the semiconductor substrate 200, and each of the source/drain regions 218 comprises a sidewall 218-1 and a bottom 218-2, a second semiconductor layer 224 being sandwiched between the channel region 201 and a portion of the sidewall 218-1 distant from the bottom 218-2, a first semiconductor layer 214 being sandwiched between the semiconductor substrate 200 and at least a portion of the bottom 218-2 distant from the sidewall 218-1, and an insulating layer 220 being sandwiched between the semiconductor substrate 200 and the other portions of the bottom 218-2 and/or the other portions of the sidewall 218-1.

The semiconductor substrate 200 may be any basic semiconductor substrate, e.g. Si, Ge, SiGe, GaAs, InP, or Si:C, etc. The semiconductor substrate 200 may comprise various doping configurations and may further comprise an epitaxial layer.

The material of the first semiconductor layer 214 and the material of the source/drain regions 218 may be different from the material of the semiconductor substrate 200. When the material of the semiconductor substrate 200 is Si, the material of the first semiconductor layer may be one of $Si_{1-X}Ge_X$, Ge, and Si:C, or a combination thereof. When the material of the semiconductor substrate 200 is Si, the material of the insulating layer 220 may be one of semiconductor oxide, semiconductor nitride, and a dielectric material with a high dielectric constant (high-K), or a combination thereof. In the specification, the term "combination" may be a stack structure, in which adjacent layers are of different materials. When the material of the semiconductor substrate 200 is Si, the material of the second semiconductor layer 224 is one of Si, $Si_{1-X}Ge_X$, Ge, and Si:C, or a combination thereof. In particular, the thickness of the first semiconductor layer 214, the insulating layer 220, and/or the second semiconductor layer 224 may be 5 nm~20 nm, e.g. 10 nm or 15 nm.

Optionally, the gate stack may comprise a gate dielectric layer 204 and a gate electrode 206. The gate dielectric layer 204 may be of a commonly used gate dielectric material, e.g. silicon oxide or silicon oxynitride, or a high-K gate dielectric layer, e.g. any one of $HfO_2$, HfSiO, HfSiON, HfTaO, HfTiO, HfZrO, $Al_2O_3$, $La_2O_3$, $ZrO_2$, LaAlO, or a combination of a plurality of these materials. The gate electrode 206 may have a structure of one or more layers, and may be of metal, metal compound, polysilicon, metal silicide, or a combination thereof. The gate stack may also comprise other structures such as spacers. This embodiment of the present invention has two layers of spacers 210-1 and 210-2 as an example. In other embodiments, the gate stack may comprise no spacers. The spacers are not essential to the present invention.

The semiconductor device is formed on active regions. The active regions are isolated by an isolating structure 202. The first semiconductor layer 214 is connected to the isolating structure 202. The isolating structure 202 may be a conventional structure in the art, e.g. STI (Shallow Trench Isolation), or any suitable structure capable of isolating the active regions. The particular form of the isolating structure 202 is not essential to the present invention.

Next, the method for forming the semiconductor device will be described in detail with reference to FIGS. 1~5.

Figure 1:
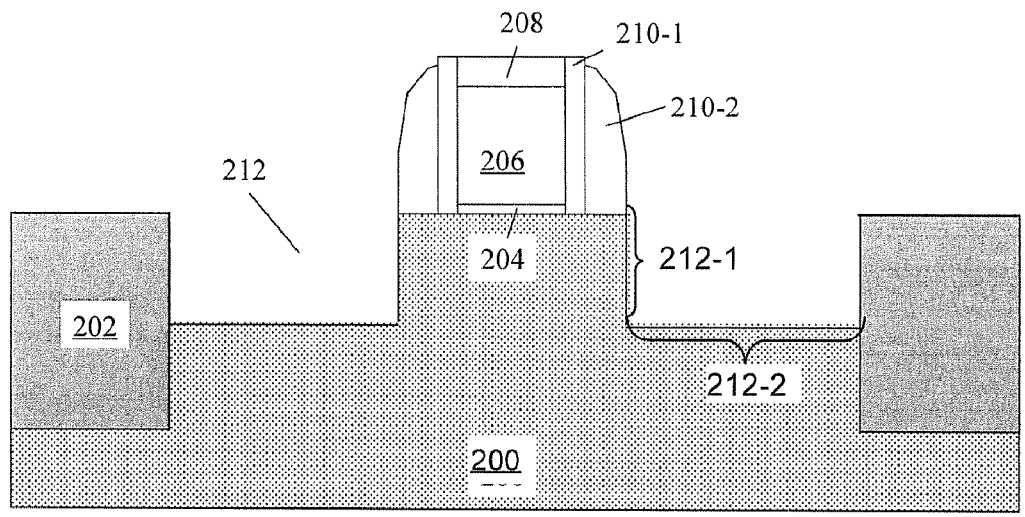
FIGS. 1-5 show structure diagrams in respective stages in one embodiment of the method for forming a semiconductor device according to the present invention.

First, as shown in FIG. 1, a gate stack is formed on a semiconductor substrate 200. Recesses 212 are formed in the semiconductor substrate 200 using the gate stack as a mask. The recess 212 has a sidewall 212-1 and a bottom 212-2.

The semiconductor substrate 200 preferably comprises an isolating structure 202. In this embodiment, the semiconductor substrate 200 is a silicon substrate (e.g. a silicon wafer) as an example. In practice, the semiconductor substrate 200 may also comprise other basic semiconductor or semiconductor compound, e.g. Ge, SiGe, GaAs, InP, or SiC, etc. In accordance with well-known design requirements in the prior art (e.g. for a p-type substrate or an n-type substrate), the semiconductor substrate 200 may comprise various doping configurations. In addition, the semiconductor substrate 200 may optionally comprise an epitaxial layer. The isolating structure 202 is for isolating active regions, and optionally comprises oxide such as silicon oxide or other insulating materials. The isolating structure 202 may be formed by the well-known STI technology in the art, or other suitable methods. The specific method for forming the isolating structure 202 is not essential to the present invention.

The gate stack may comprise a gate dielectric layer 204 and a gate electrode 206. Preferably, a nitride cap layer 208 may be formed on the gate electrode 206 to protect the gate electrode 206. The gate dielectric layer 204 may be of silicon oxide or silicon oxynitride, etc., or a high-K dielectric material, e.g. any one of $HfO_2$, HfSiO, HfSiON, HfTaO, HfTiO, HfZrO, $Al_2O_3$, $La_2O_3$, $ZrO_2$, LaAlO, or a combination of a plurality of these materials. The gate dielectric layer may be deposited by a conventional deposition process, such as Chemical Vapor Deposition (CVD), Pulse Laser Deposition (PLD), Atom Layer Deposition (ALD), Plasma Enhanced Atom Layer Deposition (PEALD), or other methods. The gate electrode 206 may have a structure of one or more layers, and may be of metal, metal compound, polysilicon, or metal silicide, or a combination thereof. The gate electrode may be deposited by a conventional deposition method of conductive materials, e.g. PVD (including evaporation, sputtering, or electron beam, etc.), CVD, PLD, PEALD, plating, or other suitable methods.

Generally, the gate stack may also comprise spacers 210, which may have a structure of one or more layers, and may be formed of silicon nitride, silicon oxide, silicon oxynitride, carborundum, or low-K dielectric material, or a combination thereof, and/or other suitable materials. In one embodiment of the present invention, the spacer has a structure of two layers, comprising a first spacer 210-1 and a second spacer 210-2.

Optionally, before forming the spacers 210, halo implantation regions (not shown) or source/drain extension regions (not shown) may be formed by tilted ion implantation in active regions of the semiconductor substrate 200.

Then recesses 212 can be formed in the semiconductor substrate 200 by etching the semiconductor substrate 200 on both sides of the gate stack by, e.g., RIE (Reactive Ion Etching) or other etching method. In one embodiment of the present invention, the recess exposes a sidewall of the isolating structure 202.

Figure 2:
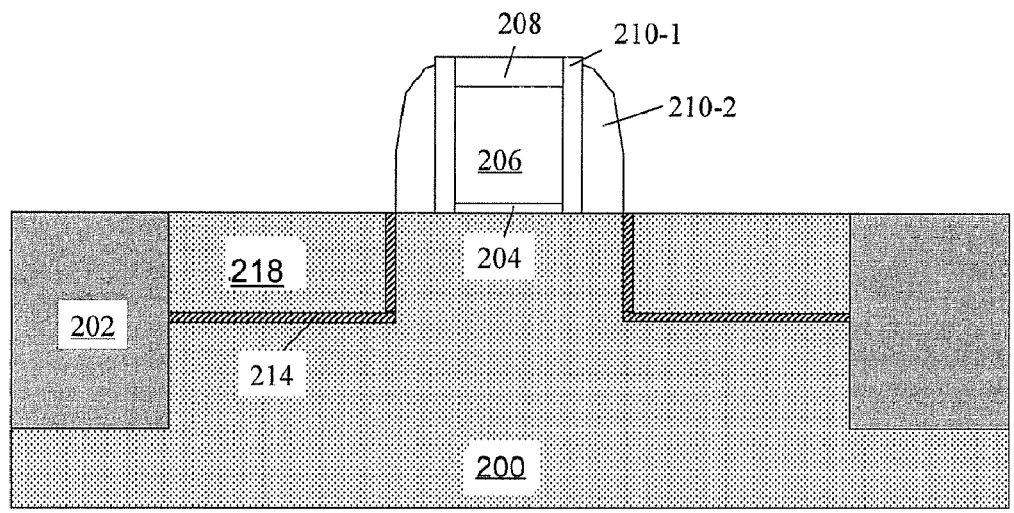

Next, as shown in FIG. 2, a first semiconductor layer 214 and a source/drain material layer 218 are formed in sequence. The first semiconductor layer 214 covers the sidewall 212-1 and the bottom 212-2. (Note: since the recess 212 disappears after the first semiconductor layer 214 and the source/drain material layer 218 are formed, the reference sign of the recess 212 will not appear in FIG. 2 and the following figures.) The material of the first semiconductor layer 214 is different from the material of the semiconductor substrate 200 and the material of the source/drain material layer 218.

In particular, the first semiconductor layer 214 may be formed on the sidewall 212-1 and the bottom 212-2 of the recess 212 by epitaxial growth (Epi). When the material of the semiconductor substrate 200 is Si, the material of the first semiconductor layer 214 is one of $Si_{1-X}Ge_X$ (0<X<1), Ge, and Si:C, or a combination thereof. It should be noted that, since the sidewall of the recess 212 close to the isolating structure 202 is also a sidewall of the isolating structure 202, and the material of the isolating structure 202 is distinctively different from the material of the semiconductor substrate 200, the first semiconductor layer 214 formed by epitaxial growth is only formed on the bottom 212-2 of the recess 212 and the sidewall 212-1 close to the gate stack. The thickness of the first semiconductor layer 214 is 5 nm~20 nm, e.g. 10 nm or 15 nm.

Then, a source/drain material layer 218 may be formed on the first semiconductor layer 214 by epitaxial growth. The material of the source/drain material layer 218 is selected among those that may be used to form the semiconductor substrate 200. The material of the source/drain material layer 218 may or may not be the same as that of the semiconductor substrate 200. In one embodiment of the present invention, the source/drain material layer 218 may be of silicon.

Figure 3:
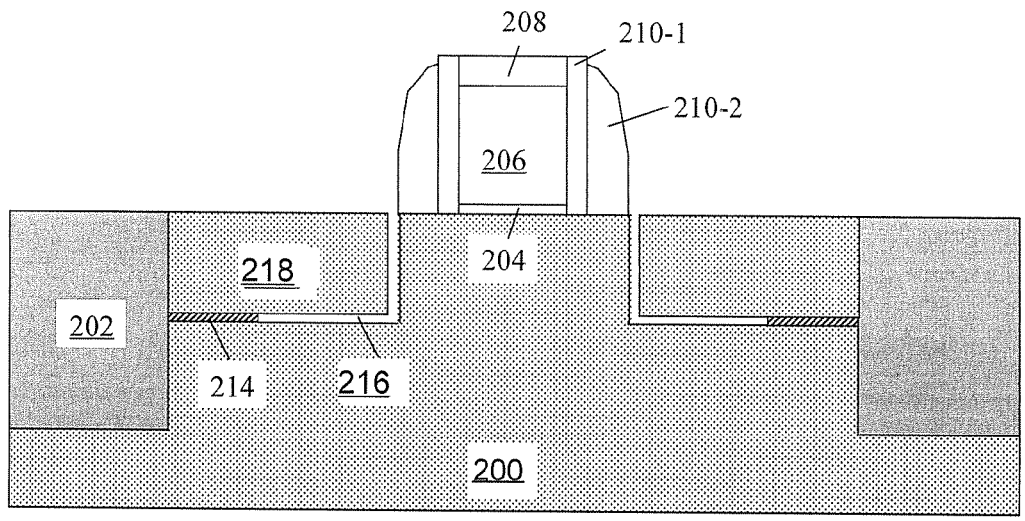

Next, as shown in FIG. 3, a portion of the first semiconductor layer 214 is removed to form a first gap 216, which exposes at least the sidewall 212-1.

In particular, the first semiconductor layer 214 may be selectively etched by wet etching or dry etching to form a first gap 216 between the source/drain material layer 218 and the sidewall 212-1 as well as a part of the bottom 212-2 of the recess. The etching may be precisely controlled by adjusting the concentration of the etchant and etching time.

Figure 4:
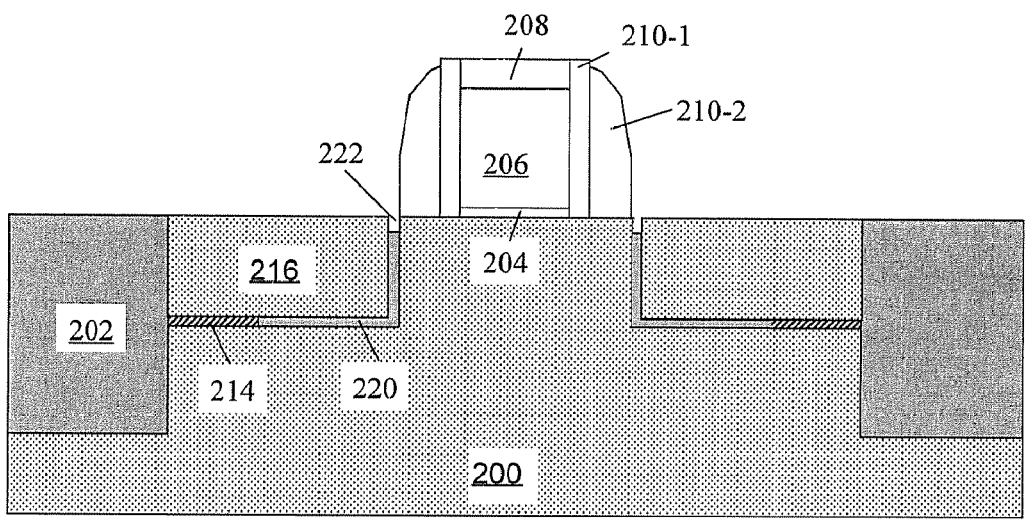

Then, as shown in FIG. 4, a portion of the first gap 216 is filled by an insulating material 220 to form a second gap 222, which exposes a portion of the sidewall 212-1 close to the gate stack.

In particular, filling the portion of the first gap 216 with the insulating material 220 may comprise: performing a passivation process on the semiconductor substrate 200 to form a passivation layer in the first gap 216; and then removing a portion of the passivation layer close to the gate stack. The passivation process may be executed by thermal oxidation. When the material of the semiconductor substrate 200 is Si, the material of the passivation layer may be silicon oxide.

In addition, filling the portion of the first gap 216 with the insulating material 220 may alternatively comprise: filling the first gap 216 with the insulating material 220; and then removing a portion of the insulating material 220 close to the gate stack. The first gap 216 may be filled using HARP (High Aspect Ratio Process). When the material of the semiconductor substrate 200 is Si, the insulating material may be one of semiconductor oxide (e.g. silicon oxide), semiconductor nitride (e.g. silicon nitride or silicon oxynitride), and high-K dielectric material as mentioned above, or a combination thereof.

Then, a portion of the insulating material 220 close to the gate stack may be etched selectively by wet etching or dry etching, to form the second gap 222.

Finally, as shown in FIG. 5, the second gap 222 is filled with a second semiconductor layer 224.

The second semiconductor layer 224 may be formed by epitaxial growth in the second gap 222, to reserve a carrier transfer path between the source region and the drain region.

In a preferred embodiment of the present invention, the material of the second semiconductor layer 224 is the same as that of the source/drain material layer 218 and the semiconductor substrate 200. In other embodiments of the present invention, the second semiconductor layer 224 may be of silicon. Thus, the part of the source/drain region (provided by the source/drain material layer 218 or doped source/drain material layer 218) which is distant from the gate stack is isolated from the semiconductor substrate 200, to prevent carriers in the source/drain region from diffusing into the semiconductor substrate 200. Also, a carrier transfer path between the source/drain region and the channel region is provided.

According to the semiconductor device and the method for forming the same provided by the present invention, the second semiconductor layer formed between the source/drain region and the channel region near the gate stack helps maintaining a carrier transfer path between the source/drain region and the channel region near the gate stack. The insulating layer formed between the source/drain region and the channel region distant from the gate stack forms an isolating region between the source/drain region and the channel region distant from the gate stack, and helps preventing the dopants in the source/drain region from diffusing into the substrate.

The exemplary embodiments and advantages thereof have been explained in detail, however, the embodiments may be varied, replaced, and modified without departing from the spirit of the present invention and the protection scope defined by the attached claims. As for other examples, those skilled in the art will understand that the order of the steps of the process may change within the protection scope of the present invention.

Furthermore, the scope of the present invention is not limited to the processes, structures, manufacturing, compositions, means, methods, and steps of the specific embodiments as described in the specification. According to the disclosure of present invention, a person skilled in the art will easily appreciate that, when the processes, structures, manufacturing, compositions, means, methods, and steps currently existing or to be developed in future are adopted to perform functions substantially the same as corresponding embodiments described in the present invention, or achieve substantially the same effects, a person skilled in the art may make applications of them under the teaching of the present invention, without deviating from the scope of the present invention defined by the claims.

What is claimed is:

1. A semiconductor device, which is formed on a semiconductor substrate, comprising a gate stack, a channel region, and source/drain regions, wherein the gate stack is on the channel region, the channel region is in the semiconductor substrate, the source/drain regions are embedded in the semiconductor substrate, and each of the source/drain regions comprises a sidewall and a bottom, a second semiconductor layer being sandwiched between the channel region and a portion of the sidewall distant from the bottom, a first semiconductor layer being sandwiched between the semiconductor substrate and at least a portion of the bottom distant from the sidewall, and an insulating layer being sandwiched between the semiconductor substrate and the other portions of the bottom and/or the other portions of the sidewall.

2. The semiconductor device according to claim 1, wherein the material of the first semiconductor layer is different from the material of the semiconductor substrate and the material of the source/drain regions.

3. The semiconductor device according to claim 1, wherein, when the material of the semiconductor substrate is Si, the material of the first semiconductor layer is at least one material selected from a group consisting of Si1-XGeX, Ge, and Si:C.

4. The semiconductor device according to claim 1, wherein the material of the insulating layer is at least one material selected from the group consisting of semiconductor oxide, semiconductor nitride, and a dielectric material with a high dielectric constant.

5. The semiconductor device according to claim 1, wherein, when the material of the semiconductor substrate is Si, the material of the second semiconductor layer is at least one material selected from a group consisting of Si, Si1-XGeX, Ge, and Si:C.

6. The semiconductor device according to claim 1, wherein the thickness of the first semiconductor layer, the insulating layer, and/or the second semiconductor layer is 5 nm~20 nm.

* * * * *